(12) United States Patent
D'Alfonso et al.

(10) Patent No.: US 10,837,774 B2
(45) Date of Patent: Nov. 17, 2020

(54) SYSTEM AND METHOD FOR CALIBRATING MAGNETIC SENSORS IN REAL AND FINITE TIME

(71) Applicant: Gipstech S.R.L., Rende (IT)

(72) Inventors: Luigi D'Alfonso, Rende (IT); Gaetano D'Aquila, Rende (IT); Giuseppe Fedele, Rende (IT)

(73) Assignee: GIPSTECH S.R.L., Rende (IT)

( * ) Notice: Subject to any disclaimer, the term of this patent is extended or adjusted under 35 U.S.C. 154(b) by 281 days.

(21) Appl. No.: 16/075,334

(22) PCT Filed: Feb. 1, 2017

(86) PCT No.: PCT/IT2017/000018
§ 371 (c)(1),
(2) Date: Aug. 3, 2018

(87) PCT Pub. No.: WO2017/134695
PCT Pub. Date: Aug. 10, 2017

(65) Prior Publication Data
US 2019/0041209 A1 Feb. 7, 2019

(30) Foreign Application Priority Data

Feb. 4, 2016 (IT) .......................... 102016000011371

(51) Int. Cl.
*G01C 17/38* (2006.01)
*G01C 17/04* (2006.01)
(Continued)

(52) U.S. Cl.
CPC .............. *G01C 17/38* (2013.01); *G01C 17/04* (2013.01); *G01C 21/10* (2013.01); *G01C 25/005* (2013.01);
(Continued)

(58) Field of Classification Search
CPC ........ G01C 17/38; G01C 17/04; G01C 21/10; G01C 25/005; G01C 21/206;
(Continued)

(56) References Cited

U.S. PATENT DOCUMENTS

| 4,797,841 A * | 1/1989 | Hatch .................... G01C 17/38 324/245 |
| 7,119,533 B2 * | 10/2006 | Tamura .................. G01C 17/38 324/202 |

(Continued)

FOREIGN PATENT DOCUMENTS

WO 2014028789 A1 2/2014

OTHER PUBLICATIONS

Vcelak J, P Ripka, Platil A, Kaspar Kubik J and P, Errors of AMR compass and methods of Their compensation, Sensors Actuators 129, 53-7, 2006.

(Continued)

*Primary Examiner* — Yaritza Guadalupe-McCall
(74) *Attorney, Agent, or Firm* — Volpe Koenig

(57) ABSTRACT

The present invention relates to a calibration method of magnetic sensors, for removing from the measurements the so-called "bias" and obtaining the actual measurement of the magnetic field. This method, in addition to measurements of such magnetic sensors, uses measurements of angular rotation sensors available in various types of commercial devices including smartphones. The present invention also relates to a corresponding system for determining the instantaneous real time orientation and/or position of a mobile device with respect to a magnetic field.

12 Claims, 5 Drawing Sheets

(51) Int. Cl.
*G01C 21/10* (2006.01)
*G01C 25/00* (2006.01)
*G01R 33/00* (2006.01)
*G01R 35/00* (2006.01)

(52) U.S. Cl.
CPC ....... *G01R 33/0017* (2013.01); *G01R 35/005* (2013.01)

(58) Field of Classification Search
CPC ...... G01C 22/006; G01C 21/12; G01C 21/16; G01C 21/20; G01R 35/005; G01R 33/0017
See application file for complete search history.

(56) References Cited

U.S. PATENT DOCUMENTS

| | | | | |
|---|---|---|---|---|
| 7,324,906 B2* | 1/2008 | Sato | ................ | G01C 17/38 33/356 |
| 7,832,111 B2* | 11/2010 | Lagouge | ................ | G01C 21/08 33/355 R |
| RE44,582 E* | 11/2013 | Handa | ................ | 702/92 |
| 8,676,528 B2* | 3/2014 | Almalki | ................ | G01C 17/38 702/96 |
| 9,417,091 B2 | 8/2016 | Troni-Peralta et al. | | |
| 10,281,282 B2* | 5/2019 | Trigoni | ................ | G01C 21/206 |
| 10,393,848 B2* | 8/2019 | Blagojevic | ................ | G01R 33/0017 |
| 2006/0021238 A1* | 2/2006 | Sato | ................ | G01C 17/38 33/356 |
| 2006/0111882 A1 | 5/2006 | Subbarao | | |
| 2014/0336970 A1 | 11/2014 | Troni-Peralta et al. | | |
| 2015/0260543 A1 | 9/2015 | Rantalankila et al. | | |
| 2018/0120406 A1* | 5/2018 | Blagojevic | ................ | G01R 33/0017 |
| 2019/0041209 A1* | 2/2019 | D'Alfonso | ................ | G01C 17/04 |

OTHER PUBLICATIONS

Giancarlo Troni and Louis L. Whitcomb in "Adaptive Estimation of Measurement Bias in Three-Dimensional Field Sensors with Angular-Rate Sensors: Theory and Comparative Experimental Evaluation" published in the acts of Robotics: Science and Systems, 2013.

* cited by examiner

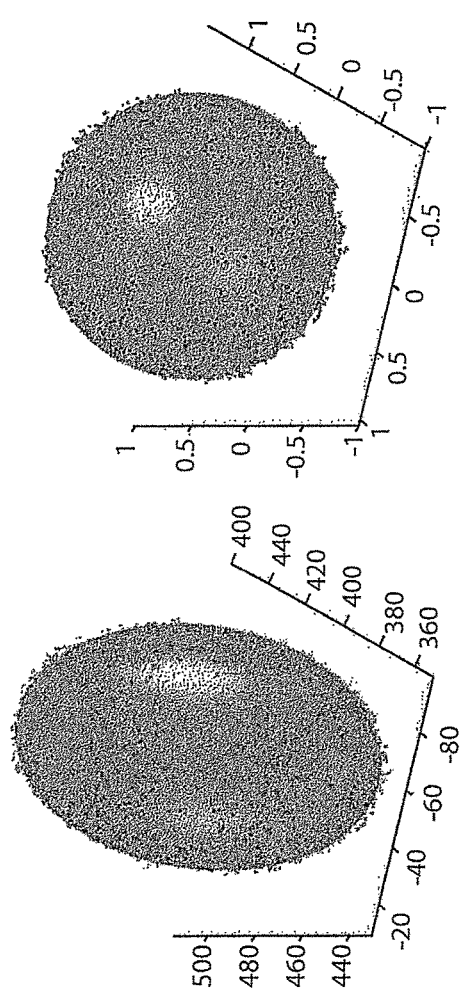
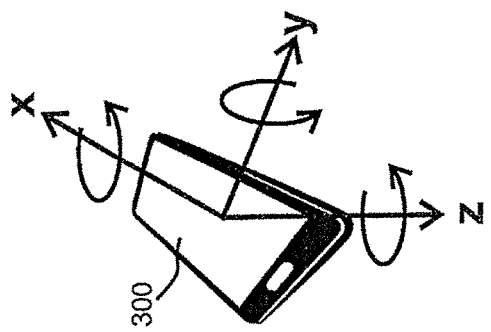
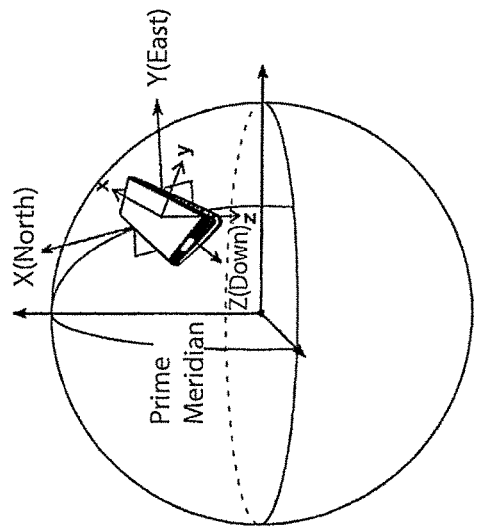
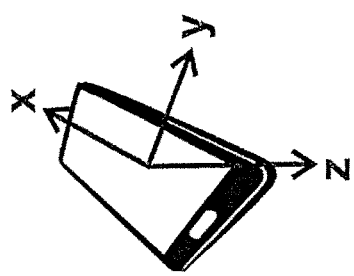
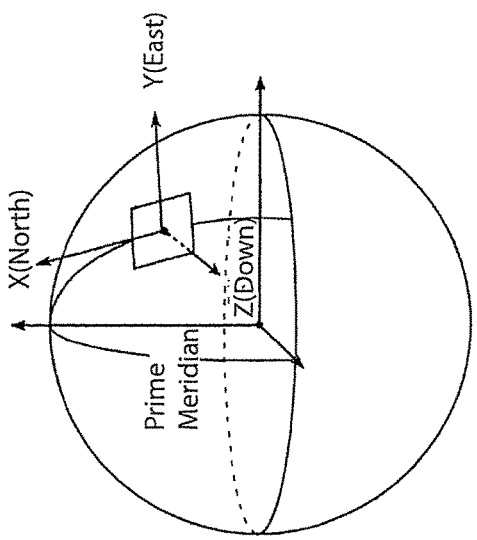
Fig. 1A
Fig. 1B
Fig. 2A
Fig. 2B
Fig. 2C
Fig. 3

SYSTEM AND METHOD FOR CALIBRATING MAGNETIC SENSORS IN REAL AND FINITE TIME

The present invention relates to a method for real and finite time calibration of magnetometers.

In particular, the present invention relates to a method for estimating the value of the corrective three-dimensional vector, or better known as "bias", necessary to obtain the actual magnetic measurement from measurements obtained by conventional magnetometers and angular rotation sensors available to within various types of commercial devices including smartphones. The present invention especially concerns calibration of magnetometers using the magnetic field measurements and the angular rotation obtainable for example by the gyroscopes, present inside navigation systems.

STATE OF PRIOR ART

To allow the use of navigation and tracking systems the GPS system is currently known and used. Systems based on the GPS, however, are not capable of operating inside buildings because normally the signal from the satellites is not able to penetrate inside closed places. To enable location services in enclosed places other methods are often used such as but not limited to those using radio signals maps, machine vision systems, inertial measurement systems, distance measurement systems and others. All the systems described above can be relatively expensive and require installation of supporting infrastructure within the enclosed space in which one wants to enable location services. Other location methods instead can include the use of magnetic fields such as but not limited to the Earth's geomagnetic field (EMF, Earth Magnetic Fied). Such methods, in order to function, do not need the installation of a costly infrastructure and can avail themselves of magnetic sensors (magnetometers or compasses) and the measurement of other physical quantities such as the angular rotation and/or the acceleration. These magnitudes are commonly measured through low cost sensors which include those available on common smartphones.

Currently on the market, there are different types of sensors. The most common ones are the sensors built with MEMS technology (Micro-ElectroMechanical Systems) now present, in the form of magnetometers adapted to measure the magnetic field, gyroscopes adapted to measure angular rotation, accelerometers adapted to measure the accelerations, possibly also under form of an integrated one, on most of smartphones on the market. The magnetometers can be more or less accurate and precise, and are capable of measuring magnetic fields of different types also including the Earth's geomagnetic field, producing measurements both in terms of amplitude and in terms of three-dimensional vector. The vector measurement of said magnetic fields is represented within a reference system, like that shown in FIG. 2B, integral to said magnetometer.

A preferred application of the magnetometers is linked to their use for the measurement of the Earth's geomagnetic field.

In any position of the globe, the geomagnetic field is measured by said magnetometer as a three-dimensional vector represented in said reference system integral to the magnetometer (FIG. 2B). Said geomagnetic vector is also determined through the use of mathematical models which receive in the input the geographical coordinates (latitude, longitude and altitude) of the point where said magnetometer was located and provide, for a precise moment in time, the same value of the geomagnetic vector as measured by said magnetometer in said reference system of the magnetometer, however, represented in a new external reference system. Said reference system external to the magnetometer can, for example, but not by way of limitation, be the NED (North, East, Down) system as represented in FIG. 2A. Normally the geomagnetic vector obtained from said mathematical model and expressed in said external reference system assumes the name of the geomagnetic reference vector $m_0$ and is superimposed on the Earth's geomagnetic field lines originating at the South Pole and directed toward the North Pole. Knowledge of such vector $m_0$ determined in said external reference system and the same vector instead measured by said magnetometer in said magnetometer reference system is used to determine the angle necessary to complete the rotation and to align the X and Y axes of said reference system of the magnetometer to those of said external reference system after a first rotation, that render parallel the Z-axes of said two systems of reference, has been previously made. The above description is the basic principle of operation of each compass which uses the Earth's magnetic field measurement to identify the direction corresponding to the Magnetic North: the compass needle is always aligned along the field lines and always indicating the north direction, i.e. the needle of the compass identifies the projection of said reference vector $m_0$ on the plane tangent to the earth's surface at the point where said compass has been positioned.

In localization systems for closed locations based on the use of the geomagnetic field measurements, each object to be localized is provided with at least a magnetometer which, during the movements of said object, detects sequences of geomagnetic field measurements. Subsequently said sequences can be compared with other previously recorded sequences and stored in a database. The foregoing sequences stored in said database constitute the map of the variation of the geomagnetic signal within the enclosed space and have the peculiarity of being associated, during that previous discovery operation, to the spatial coordinates of said enclosed space at which the previous detection was carried out. The determination of the similarity index between said sequence detected by said moving object and said sequences stored in said map of said closed place allows to establish the position of said moving object within said closed place.

In orientation measurement systems, the measurements taken by the magnetometer are used to determine the angle that the magnetometer forms with respect to magnetic north.

It is evident that the magnetic measurements obtained by said magnetometer must be as precise as possible otherwise the larger the measurement errors, the more unreliable the relative orientation determination between said reference system of the magnetometer and said external reference system, thus making unusable these measures within systems which require a good level of accuracy, reliability and stability.

In general, the magnetic field measurements obtained by means of a magnetometer are affected by different types of distortions which in fact make unusable the achievable measurement without first carrying out specially designed calibration procedures capable of removing such distortions. For a detailed discussion of the type of distortion present in the measurements from a magnetometer, reference is made to [Včelák J, P Ripka, Platil A, Kaspar Kubik J and P, *Errors of AMR compass and methods of Their compensation*, Sensors Actuators 129, 53-7, 2006].

For the sake of simplicity, it can be assumed that the measurement of the magnetic field obtainable by a magnetometer can be corrupted due to the presence of various ferromagnetic materials located in proximity of said magnetometer. For example, even in respect to the size of the printed circuit itself, where the magnetometer is located, there may be screws, connectors and other ferromagnetic components that distort the geomagnetic field measured by the magnetometer. Normally said ferromagnetic materials are not symmetrically and uniformly distributed around the magnetometer sensor and accordingly the distortion which they introduce into the measurement may be dependent on the orientation of said magnetometer with respect to the incident magnetic field.

To compensate for these distortions, it is necessary to calibrate said magnetometer by determining a priori the correction factors to be applied to each measurement axis for removing such distortions. Although it may seem that the calibration applied for example in the factory can permanently solve the problem of measurement accuracy, in reality this is not true. In fact, it is easy to imagine that several factors may impact on the measurement accuracy of the magnetometer after it has been calibrated. For example, any batteries (eg. Lithium, or alkaline) present inside the device that houses the magnetometer, may, depending on their state of charge, in a variable way distort the measured field and consequently make necessary the application of a new calibration. Or there could be other ferromagnetic components arranged around the magnetometer but that change in time their relative position with respect to the sensor. Ultimately, only one initial calibration of the magnetometer is insufficient to be able to obtain precise measurements of the magnetic field.

As it is known, the vector Earth's geomagnetic field is locally (in terms of geographic location) constant and independent of time both in terms of amplitude and in terms of vector components, and a calibrated magnetometer that performs the measurement of said vector field, by making a rotation with respect to an external reference system like that of FIG. 2A, gives a varying orientation of said vector in accordance with the size of said rotation. In other words, if we rotate the magnetometer in all possible orientations (e.g. from zero to 360° around each of its three axes) and we detect the magnetic field vectors measured in the reference system fixed to the magnetometer, like that of FIG. 2B, then during the various rotations we will notice that the graphic representation of said set of vectors approximates the surface of a sphere centered at the origin and of radius equal to the amplitude that the geomagnetic field assumes in the geographical location where said measurements were performed (FIG. 1B). The distortions that are present in the measurements made by a non-calibrated magnetometer produce, on said sphere, a translational effect that shifts its center away from the origin of the axes and a deformation effect which transforms the sphere into an ellipsoid (FIG. 1A). The invention proposes a method which allows to determine the real value of the magnetic field from the magnetic field measurement obtained from a non-calibrated magnetometer. In particular, if $\tilde{m}(t)$ is the vector of real three-dimensional magnetic field, then the magnetic field measurement obtained by a non-calibrated magnetic sensor can be modeled as follows:

$$m^*(t) = A(\tilde{m}(t) + b) \qquad \text{EQ 1}$$

wherein $m^*(t) \in R^3$ represents the 3D vector of the magnetic field measurement affected by distortions on the non-calibrated magnetometer, $A \in R^{3 \times 3}$ is a matrix that represents the distortion present on each measuring axis, said matrix represents the contribution necessary to correct the shape of the measurements place bringing the surface of the ellipsoid shown in FIG. 1A on the surface of the sphere shown in FIG. 1B; $b \in R^3$ represents the three-dimensional vector of ferromagnetic bias responsible for the translation of the center of the sphere which sees said center move further away from the source the greater the size of the distortion.

The calibration problem solved by this invention is to define an effective and efficient method which is able to determine a value estimate of the bias vector $b \in R^3$ assuming that the matrix $A \in R^{3 \times 3}$ is known a priori. This assumption is not a limitation since said matrix can easily be predetermined a priori and remains generally constant not being affected by the previously described variables distortions and entirely contained within the vector $b \in R^3$.

Subsequently, the bias estimate is used to correct the measurements from the magnetometer by deriving from EQ 1 the value of the real geomagnetic field $\tilde{m}(t)$ and consequently the value of the field purified from the bias b:

$$\tilde{m}(t) = A^{-1} m^*(t) - b \qquad \text{EQ 2}$$

One additive bias estimation method is described in the U.S. patent application US 2015/0260543. This application describes a method for estimating the bias of the magnetometer on the basis of multiple acquisitions of the Earth's geomagnetic field measurements and orientation measurements from a sensor adapted to measure angular rotations. This traditional method provides the acquirement of a first set of measurements of the geomagnetic field detected by a magnetometer and orientation measurements detected by a sensor adapted to measure angular rotation. It then provides to detect a second set of geomagnetic field measurements and orientation measurements, and subsequently to determine the estimate of the bias value of the magnetometer by calculating said estimate as the value that minimizes the distances between the geomagnetic measurements present inside the second set of measurements and geomagnetic measures present in the first set of measurements which have been rotated in the corresponding angle determined from the orientation measurement detected by the sensor adapted to measure angular rotations.

This traditional method takes, as its basic principle, as pointed out earlier, that local rotations of the calibrated geomagnetic vector produce as locus of vectors the sphere centered at the origin and shown in FIG. 1B. In fact, as fully described in said patent application, the result of the rotation obtainable by the measurements of the angle sensors at different geomagnetic vectors depends on the origin of the vector to which the rotation is applied. In the real case, in which the measurement of the magnetometer is corrupted by the presence of the bias, with the consequent displacement of the origin of geomagnetic vectors measured by the magnetometer, then applying a rotation to the two geomagnetic field vectors performed in said first set of measurements and said second set of measurements, respectively V1 and V2, does not produce the effect of getting two overlapping vectors and arranged on the radius of the sphere shown in FIG. 1B. Ultimately, this traditional method solves the problem of estimating the bias by a search algorithm of the correct origin of rotations of the vectors such that the resulting locus is a sphere.

Another of the additive bias estimation method is described in WO2014/028789. Also said traditional method reveals a method that combines the magnetic field measurements with orientation measurements to enable the precise calculation of the orientation of an object on which the appropriate measuring sensors of the magnetic field and the orientation in terms of angular rotations have been installed. This traditional method exploits the same basic principle of the traditional method described in US 2015/0260543, but solves the problem in a different way. This method uses sets of geomagnetic vectors measurements to calculate an estimate of bias, revealing two different grouping criteria. Said first criterion builds up said groups of measurements by combining magnetic vectors which present a component very close to being equal to zero, said second criterion builds up groups of consecutive measurements if the measurements of the vectors are separated by an angle greater than or equal to a preset threshold. The estimate of bias is then carried out starting from the solution of the search problem of the center of a set of circumferences identified by said magnetic measurements groups. The bias is determined to be equal to the amount needed to make coincident on average the centers of said circumferences.

These two traditional methods have several drawbacks. The first drawback is linked to the impossibility to define in advance in how much time an estimate of the calibration bias is obtainable, with a certain level of reliability. Furthermore, it is intuitive to demonstrate that the greater the distance (in terms of rotation angle) between the measurements belonging to the first set of measurement and the second set of measurements, the more effective the search of the center of rotation of the circumferences is. This statement is in fact also described explicitly in the text of the description of US2015/0260543 wherein said traditional method shows that a pair of measurements is generally not sufficient to determine an estimate of bias and shows, inside FIG. 5E of said application US 2015/0260543, the benefit that this method can achieve in terms of bias of the estimate if the measurements that belong to the two sets of measurements have been carried out when the rotation of the portable system has at least described one of the circumferences extractable from a sphere (intersected by a plane) or significant sectors of that circumference. Same reasoning is applicable to the traditional method described in WO 2014/028789.

From the above, it follows that the second drawback of these traditional methods, namely the need for the device hosting the magnetometer to undergo rotations of amplitude such as to cover sectors of the sphere (if in 3D) or circumference (if in 2D) which are significant for the purposes of allowing that the least squares algorithms or the resolution of systems of equations used by the methods are able to find a solution. These traditional methods are insufficient for example in a classical context that sees as measuring instrument the use of a smartphone held in a user's pocket, which is subjected to excursions—understood in terms of angles of rotation for each of the three axes of measurement—that may not be sufficient to cover significant sectors of a circumference (or a sphere) and then to allow said traditional methods to determine the bias. Or these excursions may be such that the time required for the determination of the solution is unacceptable for the purposes of the overall functioning of the system.

Ultimately, the commonly used geometric approach made on these traditional methods does not guarantee that under certain conditions it is possible to find a solution to the problem and does not guarantee that, if the solution is admissible, the latter can be found in a set time.

Another method for estimating the bias with an analytical approach is described by Giancarlo Thrones and Louis L. Whitcomb in "*Adaptive Estimation of Measurement Bias in Three-Dimensional Field Sensors with Angular-Rate Sensors: Theory and Comparative Experimental Evaluation*" published in the acts of Robotics: Science and Systems, 2013. This traditional method starts from an analytical model previously used and reveals three different methods for the solution. Said model is summarized as follows.

The Earth's geomagnetic field is locally known and constant. If $m_0$ is the magnetic reference vector (therefore constant) expressed in the NED (North, East, Down) external reference system of FIG. 2A, then there exists a matrix $R(t) \in R^{3 \times 3}$ that represents the rotation matrix at the time t that accomplishes the rotation needed to pass said reference vector from the reference system of the device (FIG. 2B) to the NED reference system (FIG. 2A). Using the previous EQ 2, it is possible, by making the appropriate transformations, to rewrite as follows:

$$m_0 = R(t)(A^{-1}m^*(t)-b) \qquad \text{EQ. 3}$$

Whereas the known value of the matrix A as non-variable and determinable a priori, for simplicity of notation we can indicate with $m(t)=A^{-1}m^*(t)$ and replace it inside the EQ. 3, obtaining:

$$m_0 = R(t)(m(t)-b) \qquad \text{EQ. 4}$$

As was mentioned above, the solution of this equation is not possible in the exact way in the absence of information associated with R(t), not obtainable with only inertial data if the magnetometer is not calibrated, and various methods have been indicated above for the traditional approximated solution. Some of these methods use three-dimensional vector of angular rotation $\omega(t)=[\omega_x,\omega_y,\omega_z]$, measurable for example through the use of a gyroscope.

The rotation matrix R(t) may in fact be expressed in terms of angular rotations through the report that uses the three-dimensional vector of angular rotation $\omega(t)=[\omega_x,\omega_y,\omega_z]$ measurable for example through the use of a gyroscope:

$$\dot{R}(t) = R(t)S_\omega(t) = R(t)\begin{bmatrix} 0 & -\omega_z(t) & \omega_y(t) \\ \omega_z(t) & 0 & -\omega_x(t) \\ -\omega_y(t) & \omega_x(t) & 0 \end{bmatrix} \qquad \text{EQ. 5}$$

in which $\dot{R}(t)$ is the time derivative of R(t).

With reference to EQ. 4, if you make the derivative with respect to time variable in both sides, using the EQ. 5 and recalling that in SO(3) if R is a rotation matrix, $R^T$ is its transposed and I is the identity matrix, the following relation holds $R^T R = R R^T = I$, then we obtain the following differential equation descriptive of said calibration problem where the symbol b indicates the bias vector to be estimated:

$$S_\omega(t)b = S_\omega(t)\dot{m}(t)+ \qquad \text{EQ. 6}$$

Thrones and Louis (mentioned above) use that differential equation of formulation of the calibration problem, EQ. 6, as a starting point for describing a conventional method for the estimate of bias that requires less restrictive constraints on the movement to which the measuring device is to be subjected. However, even this method does not guarantee that the convergence of the algorithm for estimating the bias is obtained in a finite time but only asymptotically.

Other approximate solutions use, in addition to the three-dimensional vector of angular displacement, also the three-dimensional vector of the accelerations, measurable for example by an accelerometer. An example of such a solution is given in U.S. Pat. No. 9,417,091B2.

All these conventional solutions are not satisfactory, however, as explained above.

OBJECT OF THE INVENTION

The problem solved by the present invention is to eliminate or reduce the drawbacks present in the existing traditional methods.

In particular, the present invention aims to provide a system and an analytical method capable of estimating in real time and in finite time the bias necessary to perform the calibration of a magnetometer sensor using 3D vectors measurements from said magnetometer and of 3D vectors measurements from a suitable sensor to measure angular rotations, assuming that said sensors are present on board of the same and generic measuring device 300 shown in FIG. 3.

Within this aim, an object of the present invention is that of not requiring any assumption on the type of movements and rotations to which said device must be subjected during the estimation procedure.

Another object of the present invention is to not require any prior knowledge on the value of the real magnetic field locally measurable in correspondence of said device and no knowledge relevant to absolute orientation of said device.

Another object of the present invention is to ensure the estimate of the calibration bias in a finite time that can be calculated in advance.

A further object of the invention is to provide a method for determining in real time instantaneous orientation of a mobile device with respect to axis of a reference system of a magnetic field, in particular the geomagnetic field, and/or for the determination the position of said device with respect to said reference system.

A further object of the present invention is to provide a system for determining the instantaneous orientation in real time and/or the position of a mobile device with respect to a magnetic field defined in a reference system.

Invention

This aim, these and others objects which will become apparent hereinafter are achieved by a method for the real-time and finite time calibration of magnetic sensors according to claim 1 attached hereto.

Further embodiments of the method for the real-time and finite time calibration of magnetic sensors according to the invention are disclosed in the dependent claims.

DETAILED DESCRIPTION OF EMBODIMENTS OF THE INVENTION

Further features and advantages of the invention will become apparent from the description of preferred embodiments, which are not exclusive or limiting, of a method for the real-time and finite-time calibration of magnetic sensors according to the invention, illustrated only by way of indication and not by way of limitation in the accompanying drawings, in which:

FIGS. 1A and 1B show the locus of the magnetic field measurements acquired respectively by using a uncalibrated magnetometer and a calibrated magnetometer.

FIGS. 2A, 2B, 2C illustrate the two reference systems. In particular, FIG. 2A shows a known reference system, external to the sensor, and known as the NED (North, East, Down) reference system. FIG. 2B shows a reference system fixed to the device which carries out the magnetic and the angular rotation measurements. FIG. 2C shows said overlapped reference systems highlighting the angles that can be determined between said systems.

FIG. 3 shows the axes of the reference system fixed to a device capable of measuring both the magnetic field vector and the orientation vector.

MATHEMATICAL DERIVATION

Figure 4:
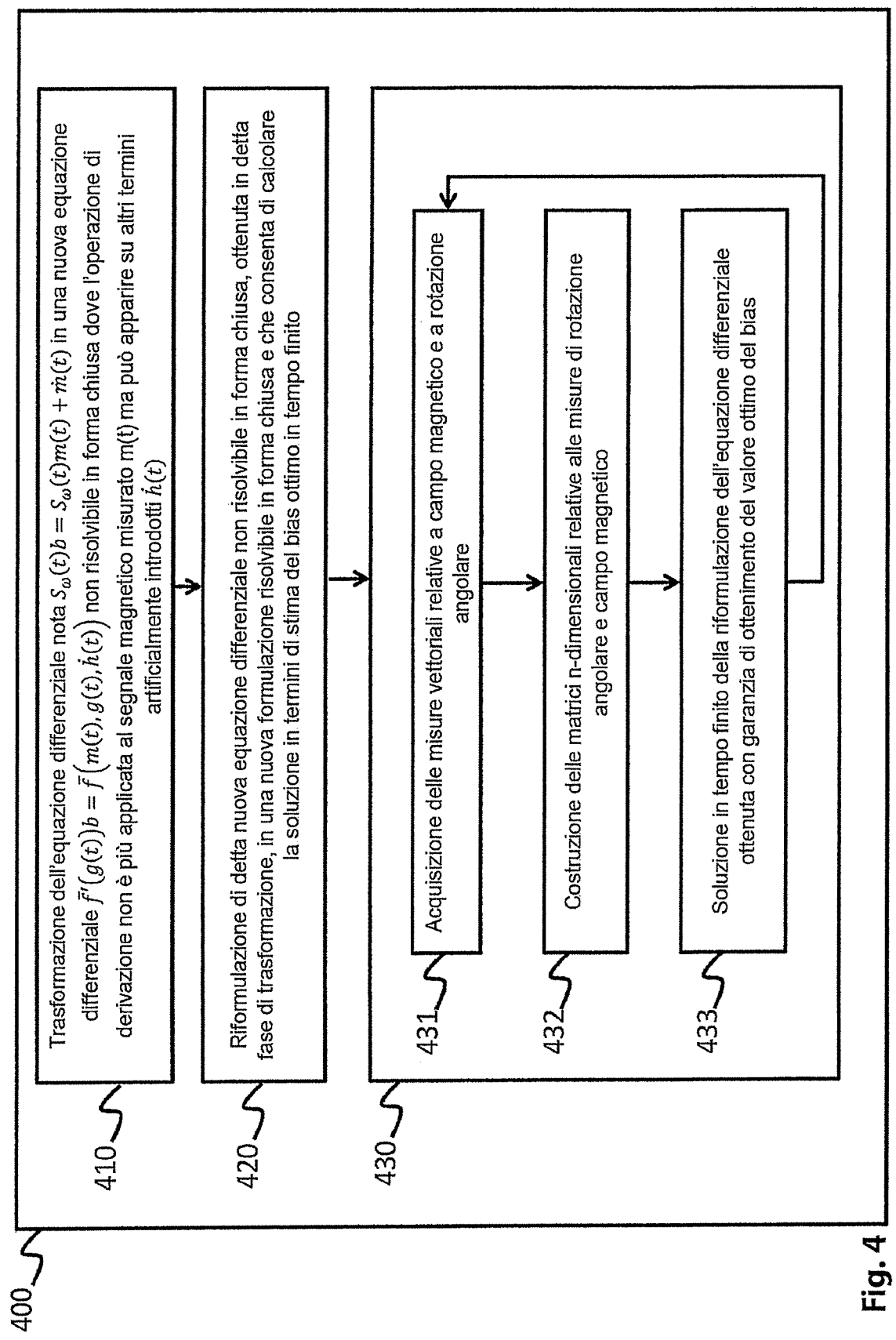
FIG. 4 illustrates a representative flow diagram of a method of estimation according to the invention.
Figure 5:
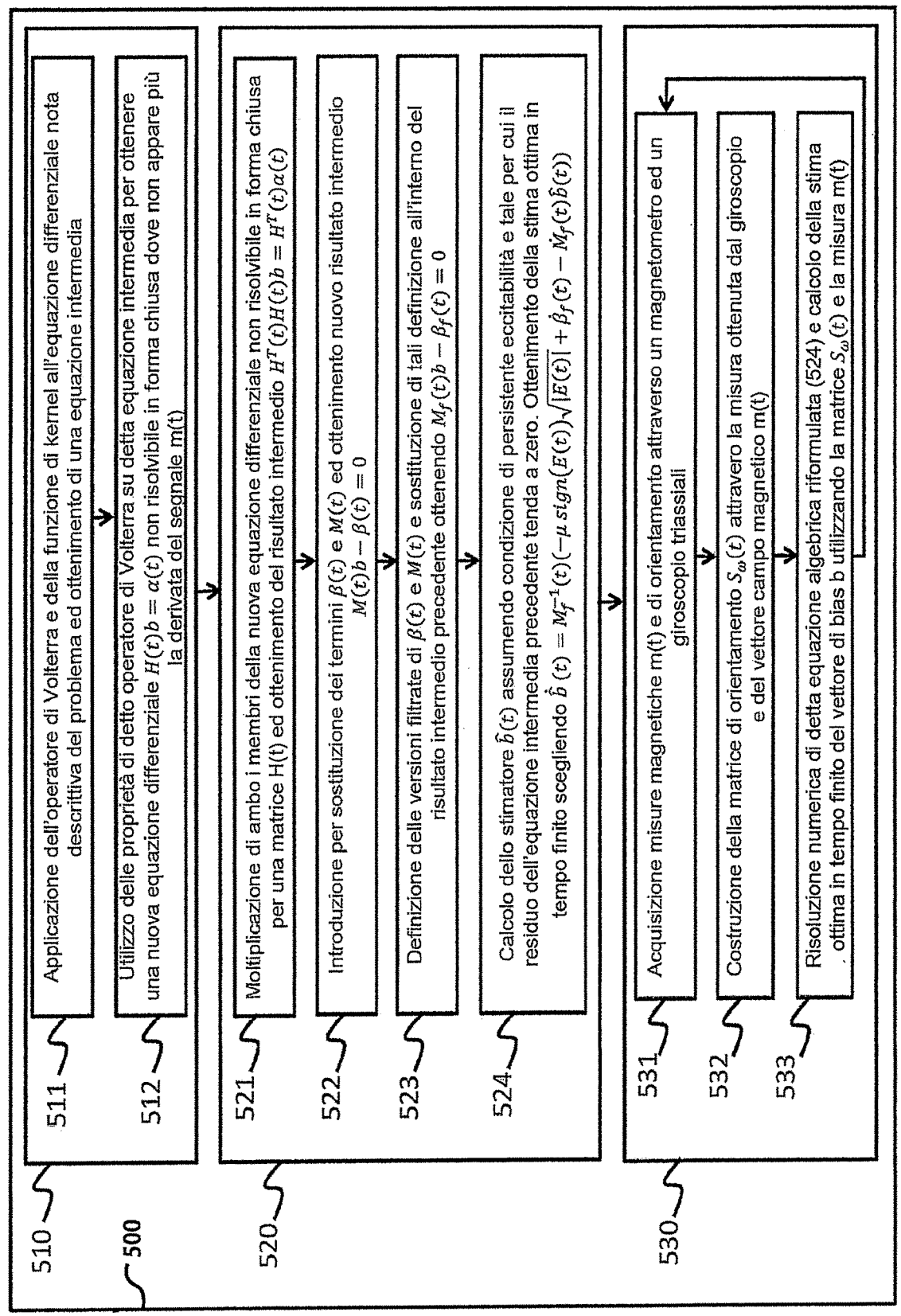
FIGS. 5 and 6 show two flow diagrams relative to two embodiments of a method for calibration of magnetic sensors according to the invention.
Figure 6:
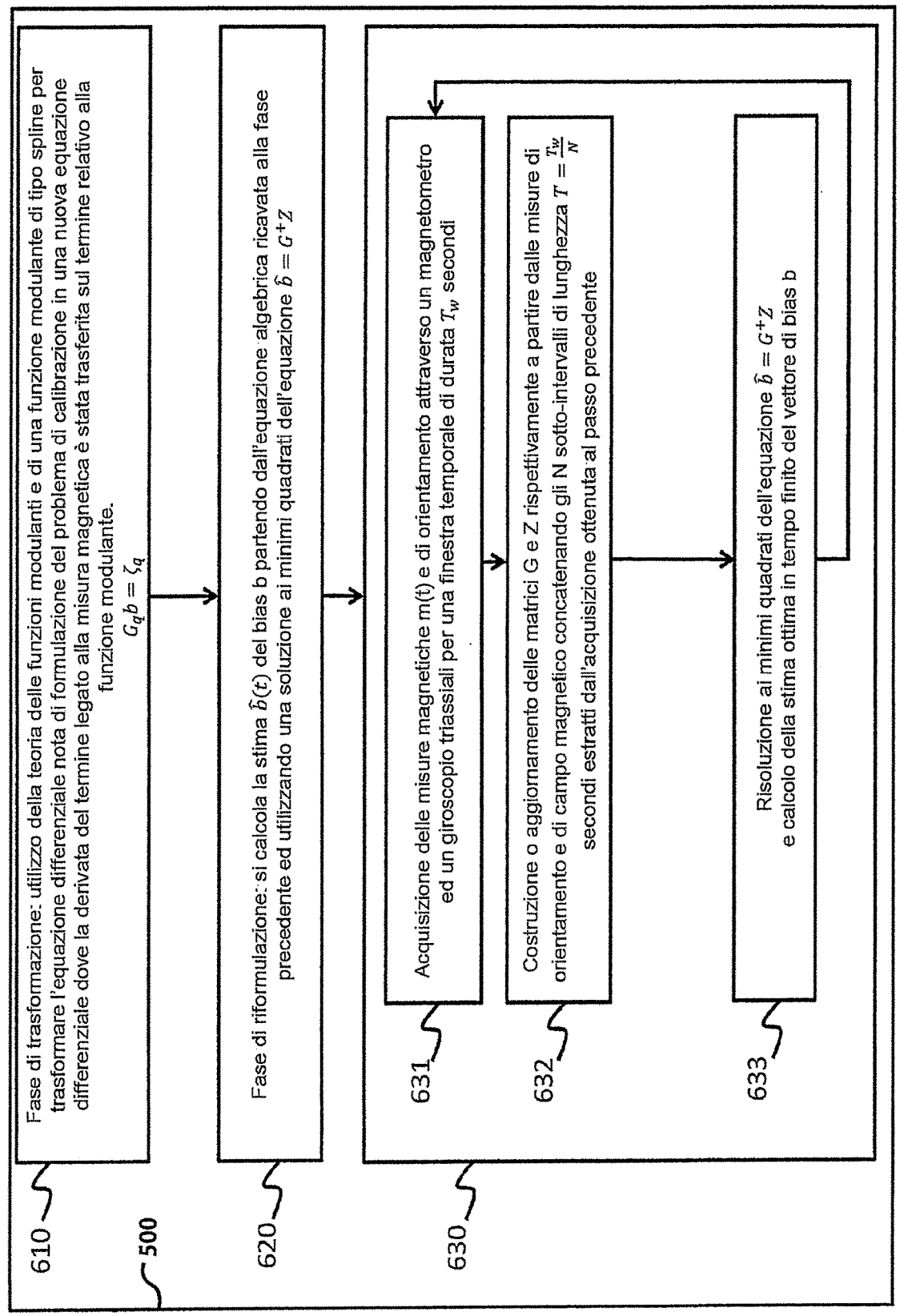

According to the invention, it is first noted that the previous EQ. 6 can be generically represented in the form:

$$f'(\omega(t))b = f(m(t), \omega(t), \dot{m}(t)) \qquad \text{EQ. 7}$$

wherein m(t) are the measurements obtained by the magnetometer, ω(t) the measurements obtained by the tool measuring the angular rotations, ṁ(t) is the derivative of the measurement obtained by the magnetometer, f'(ω(t)) is a generic 3×3 matrix whose elements are a function of the angular rotations measurements and f(m(t),ω(t),ṁ(t)) is a vector function 3×1 of the magnetic field measurements, the measurements of angular rotations and the derivative of the magnetic field measurements.

With particular reference to the above figures, the numeral 400 globally indicates a real-time and finite time calibration method of a magnetometer that, according to the present invention, has a particular characteristic in that it comprises:

A first step (410) of processing during which said differential equation formulation of the problem (EQ. 6) f'(ω(t))b=f(m(t), ω(t),ṁ(t)) is transformed into a new algebraic equation that cannot be solved in closed form f̄'(ω(t))b=f̄(m(t), ω(t),h(t)), wherein the original derivation operation applied to the measured data of the magnetic field ṁ(t) of that known differential equation is no longer present on the measured signal m(t) but it has been transferred to another term h(t) of that new algebraic equation that cannot be solved in closed form. Such new algebraic equation cannot be solved in closed form since the function f̄'(ω(t)) is not invertible.

A second step (420) of reformulation of said new algebraic equation that cannot be solved in closed form, obtained in said step of processing, in a new algebraic equation reformulated and solvable in finite-time f̄''(ω(t))b=f̄(m(t), ω(t), h(t)) and which allows to calculate the solution in terms of estimation of the optimal bias in finite time. Said reformulated algebraic equation can be solved in closed form since the function f̄'''(ω(t)) is constructed so as to be invertible.

A third step (430) for estimating the bias in finite time which provides:

A first data acquisition operation (431) during which the measurements of the magnetic field vector and the angular rotation vector are acquired.

A second operation of construction (432) of the n-dimensional matrices related to the angular rotation and magnetic field measurements obtained in said data acquisition operation.

A third operation of numeric resolution (433) of said new algebraic equation reformulated and identified in said step of reformulation for the obtaining of the optimal numerical estimate of the calibration bias in finite time using said n-dimensional matrix of angular rotation measurements and said acquisitions of the earth's magnetic field vector.

In other words, said first processing step that implements a calibration method according to the present invention produces the effect of transforming the known differential equation Eq. 7 into a new algebraic equation which has the following form:

$$\bar{f}'(\omega(t))b = \bar{f}(m(t), \omega(t), \dot{h}(t)) \quad \text{EQ. 8}$$

where it is apparent that the derivative operation has been eliminated from the term m(t) and it has been introduced onto another generic term h(t) that does not depend on either the magnetic field measurements or the orientation measurements.

For example, in accordance with the present invention, two preferred embodiments are described which respectively obtain said result of eliminating the derivatives from the magnetic field measurement by applying two different procedures which make said function h(t) dependent on results respectively obtained by applying the theory of Volterra operator and that of the modulating functions.

In a first preferred embodiment (500), said step of processing (410) provides to transform the differential equation described by EQ. 6 into a new algebraic equation using the Volterra operator. The prior art relating to the application of Volterra operator for the transformation of differential equations is described for example by T. Burton "*Volterra Integral and Differential Equations*", Elsevier, 2005, ISBN 978-0-444-51786-9.

Given a function $f \in \mathcal{L}_{loc}^2(\mathbb{R}_{\geq 0})$, where $\mathcal{L}_{loc}^2$ is the space of square integrable functions on every compact subset of $\mathbb{R}_{\geq 0}$, and $\mathbb{R}_{\geq 0}$ is the set of real numbers greater than or equal to zero, its image through the operator (integral linear) of Volterra $V_K$ induced by a Hilbert-Schmidt kernel function (the space of these functions is indicated with $\mathcal{HS}$) $K(\cdot,\cdot)$: $\mathbb{R} \times \mathbb{R} \to \mathbb{R}$ (wherein $\mathbb{R}$ is the set of real numbers) is indicated by $[V_K f](\cdot)$, and it is defined by the product:

$$[V_K f](t) \triangleq \int_0^t K(t,\tau) f(\tau) d\tau, t \in \mathbb{R}_{\geq 0} \quad \text{EQ. 9}$$

With reference to said first preferred embodiment, the chosen Hilbert-Schmidt Kernel function $K(\cdot,\cdot)$ must respect the following properties for a given $i \geq 2$:

$K(\cdot,\cdot) \in \mathcal{HS}$ and admits i-th derivatives with respect to the second argument along g the whole positive real axis;

$$\left. \frac{\partial^j}{\partial \tau^j} K(t,\tau) \right|_{\tau=0} = 0, \forall t \in \mathbb{R}_{\geq 0}, \forall j \in \{0, \ldots, i-1\}.$$

Said first preferred embodiment (500) applies the theory of Volterra operator and the properties of said chosen kernel function to said known differential equation of formulation of the problem (EQ. 6) to transform it into a new algebraic equation that cannot be solved in closed form, wherein the derivative of the signal m(t) does not appear any longer.

Advantageously, said preferred embodiment uses the following Kernel function:

$$K(t,\tau) = e^{-\rho(t-\tau)}(1-e\rho\tau) \quad \text{EQ. 10}$$

Said Kernel function eliminates said derivative of the signal m(t) and at the same time allows that some of the terms of said algebraic equation are easily calculated in a way known in itself, those terms being the analytical representation of a dynamic system of the first order (low pass filter).

In said first preferred embodiment (500), said step of processing (410) provides (510):

a first operation (511) that provides to implement the Volterra operator (EQ. 9) and said function Kernel (EQ. 10) To said known differential equation (EQ. 6) OF The formulation of the problem, getting a new intermediate equation:

$$[V_K S_\omega b](t) = [V_K S_\omega m](t) + [V_K \dot{m}](t) \quad \text{EQ. 11}$$

a second operation of exploitation of the properties of said Volterra operator (512) through which said intermediate equation (EQ. 11) can be rewritten so as to obtain said new algebraic equation that cannot be solved in closed form, wherein the derivative of the term m(t) no longer appears, which was present in that original known equation defining the problem (EQ. 6), but said branching operation has been transferred onto the Kernel function:

$$[V_K S_\omega](t)b = [V_K S_\omega m](t) + K(t,t)m(t) - \left[V_{\frac{\partial}{\partial \tau}K(t,\tau)} m\right](t) \quad \text{EQ. 12}$$

Advantageously, said second operation (512) of exploitation of the properties of the Volterra operator allows to rewrite some of the terms of EQ. 12 by the following relationships holding for the above low-pass filter of the first order:

$$[V_K S_\omega](t) = \frac{1}{s+\rho}[K(t,t)S_\omega(t)] \quad \text{Eq. 13}$$

$$[V_K S_\omega m](t) = \frac{1}{s+\rho}[K(t,t)S_\omega(t)m(t)]$$

$$\left[V_{\frac{\partial}{\partial \tau}K(t,\tau)} m\right](t) = \frac{1}{s+\rho}\left[\frac{\partial}{\partial \tau}K(t,t)m(t)\right]$$

In said substitutions in (EQ. 13), the term s represents the Laplace variable, the notation P(s)[u(·)] indicates the output of a system in the time domain P(s) having as input the signal u(·). The execution of these replacements (EQ. 13) into said intermediate equation (EQ. 12) obtained in said first step of processing (511) provides, as a result, said new algebraic equation that cannot be solved in closed form:

$$H(t)b = \alpha(t) \quad \text{EQ. 14}$$

wherein we have indicated with the term $\alpha(t)$ the following quantity $$\alpha(t) = K(t,t)m(t) - \left[V_{\frac{\partial}{\partial \tau}K(t,\tau)} m\right](t) + [V_K S_\omega m](t)$$

and $$H(t) = \frac{1}{s+\rho}[K(t,t)S_\omega(t)]$$

which can be calculated in real time and can be assumed as known since it does not depend on the unknown value of the bias b. Said new algebraic equation cannot be solved in closed form since the matrix H(t) is not reversible.

Advantageously, in said first preferred embodiment (500), it is assumed that the orientation measurements obtained in said acquisition step (431) are in agreement with the hypothesis of persistent excitability described in the following. Based on said assumption, then the matrix H(t) of said new algebraic equation (EQ. 14) is persistently exciting in $\mathbb{R}^{3\times 3}$ in the sense that there are two constants r>0, T>0 such that for every t≥0 the following occurs:

$$\int_{t-T}^{t} H^T(\tau)H(\tau)d\tau \geq rI > 0 \qquad \text{EQ. 15}$$

Note that as the said matrix $H(t) \in \mathbb{R}^{3 \times 3}$ is by definition anti-symmetric and, by the theorem of Jacobi, is not full rank and therefore is not invertible. If we assume that the system is under the condition of persistent excitability, then a filtered version of the matrix $H^T(\tau)H(\tau)$ (obtained by passing through a filter—for example a low pass filter—the elements of the matrix) has full rank and is therefore invertible.

In said first preferred embodiment (500), in said step of reformulation (420) of said new algebraic equation that cannot be solved in closed form (EQ. 14), it is provided to re-write that new algebraic equation assuming that said assumption of persistent excitability is valid, by proceeding (520):

To a first reformulation operation (521) which provides to multiply both members of said new algebraic equation (EQ. 14) by the matrix $H^T$, getting $H^T(t)H(t)b = H^T(t)\alpha(t)$;

To a second reformulation of operation (522), which provides to replace in the result of said first operation the values $\beta(t) = H^T(t)\alpha(t)$ and $M(t) = H^T(t)H(t)$, obtaining $M(t)b = \beta(t)$. If the value of the bias estimate b coincides with the exact unknown value of the bias, the previous can be written as $M(t)b - \beta(t) = 0$. Note that the terms $\beta(t)$ and $M(t)$ are calculated at each iteration.

A third optional reformulation operation (523) which provides:

A definition step which defines two filtered versions $M_f(t)$ and $\beta_f(t)$ of $M(t)$ and of $\beta(t)$:

$$\begin{cases} \dot{M}_f(t) = -\lambda M_f(t) + M(t) \\ \dot{\beta}_f(t) = -\lambda \beta_f(t) + \beta(t) \end{cases}$$

wherein $\lambda \in \mathbb{R}_{>0}$, $M_f(0) = 0_{3 \times 3}$ and $\beta_f(0) = 0_3$ with $0_{3 \times 3}$ and $0_3$ respectively matrices of zeroes and vector of zeroes; and A step of replacement that replaces said filtered versions, $M_f(t)$ and $\beta_f(t)$ in place of the nominal quantities $M(t)$ and $\beta(t)$ in the intermediate result obtained in said second resolution operation, obtaining $M_f(t)b - \beta_f(t) = 0$.

To a fourth optional resolution operation (524). In said fourth resolution operation, it is observed that if $\hat{b}(t)$ is an estimate of the sought bias b, then the equation $M_f(t)\hat{b}(t) - \beta_f(t) = 0$ is not satisfied, and instead it has a residual $E(t) = M_f(t)\hat{b}(t) - \beta_f(t)$ wherein $\dot{E}(t) = \dot{M}_f(t)\hat{b}(t) + M_f(t)\dot{\hat{b}}(t) - \dot{\beta}_f(t)$. Said fourth operation of resolution in finite time to obtain that $|E(t)| \to 0$, chooses in a particularly advantageous manner that:

$$\dot{\hat{b}}(t) = M_f^{-1}(t)(-\mu \text{sign}(E(t))\sqrt{|E(t)|} + \dot{\beta}_f(t) - \dot{M}_f(t)\hat{b}(t))$$

which was obtained using the known principle of the sliding mode (C. Edwards, SK Spurgeon, Sliding Mode Control, Taylor & Francis 1998).

In this case, if said persistent excitability assumption is valid, then the matrix $M_f$ has full rank and is reversible, therefore said equation is now solved and achieves the optimal estimation $\hat{b}(t)$ in finite time of the sought bias vector b.

Other solutions could be envisaged to acquire a sufficient number of samples of the signals of interest (magnetometer and gyroscope) so as to set a least squares problem to obtain an estimate of b.

In said first preferred embodiment (500), said estimation step bias (430) provides that (530):

the first data acquisition operation (431) uses a magnetometer and a triaxial gyroscope (without any need of an accelerometer as it is done in the prior art) for the magnetic field and orientation measurement (531).

the second operation of construction of the magnetic field vector $m(t) = [m_x, m_y, m_z]$ and the matrix constructed from the orientation data (432) from respectively (532) the magnetic field measurements and the angular rotation measurements. If $\omega = [\omega_x, \omega_y, \omega_z]$ is a 3D acquisition of the orientation measurement, then the matrix is constructed as:

$$S_\omega(t) = \begin{bmatrix} 0 & -\omega_z(t) & \omega_y(t) \\ \omega_z(t) & 0 & -\omega_x(t) \\ -\omega_y(t) & \omega_x(t) & 0 \end{bmatrix}$$

A third operation of numeric resolution (433) of said new reformulated algebraic equation identified in said step of reformulation (520), that performs (533) and ensures the optimal estimation in finite time of the bias vector b.

This guarantee of finite-time resolution pertains to the theory described for example by Mohammad Pourmahmood Aghababa in "*Finite-time synchronization of two different chaotic systems with unknown parameters via sliding mode technique*", Applied Mathematical Modelling, Volume 35, Issue 6, June 2011, Pages 3080-3091.

In a second advantageous embodiment (600), in accordance with the present invention (400), said step of processing (410) provides to transform the differential equation described by EQ. 6 into a new algebraic equation that cannot be solved in closed form using the modulating function theory (610). The prior art relevant to the use of the modulating functions theory is described for example by H. A. Preising and D. W. T. Rippin in "*Theory and application of the modulating function method-I. Review and theory of the method and theory of the spline-type modulating functions*" published in Computers & Chemical Engineering, Volume 17, Issue 1, January 1993, Pages 1-16. This known technique is used to estimate the unknown parameters of a differential equation.

A function $\phi_K(t) \in C^K$ (differentiable K times), defined over a finite time interval [0, T] and which meets the following boundary conditions:

$$\left.\frac{d^i \phi_K(t)}{dt^i}\right|_{t=0} = \left.\frac{d^i \phi_K(t)}{dt^i}\right|_{t=T} = 0, \forall i = 0, 1, \ldots, K-1 \qquad \text{EQ 16}$$

is known as the modulating function.

A generic function $f(t) \in \mathcal{L}^1$, where $\mathcal{L}^1$ is the space of absolutely integrable functions defined on [0, T] is modulated by calculating the inner product of said generic function called modulating function $\phi_K(t)$:

$$\langle f(t), \phi_K(t) \rangle = \int_0^T f(t) \phi_K(t) dt \qquad \text{EQ. 17}$$

The constraints at the boundaries, present inside EQ 16, substantially ensure that the boundary conditions of the function $f(t)$ are irrelevant after the modulation. Moreover, thanks to these constraints, one can transfer the derivation operation from the function $f(t)$ onto the modulating function $\phi_K(t)$, in such a way that there is no more need to approximate the time derivative of a signal affected by noise:

$$\left\langle \frac{d^i f(t)}{dt^i}, \phi_K(t) \right\rangle = (-1)^i \left\langle f(t), \frac{d^i \phi_K}{dt^i} \right\rangle, i=0,\ldots,K-1 \quad \text{EQ. 18}$$

Said second advantageous embodiment uses a spline function as a modulating function $\phi_K(t)$. The n-th derivative of a spline function of order K and characteristic time $$\overline{T} = \frac{T}{K}$$

is expressed by:

$$\frac{d^i \phi_K^s(t)}{dt^i} = \begin{cases} \sum_{j=0}^{K} (-1)^j \binom{K}{j} g_{ji}(t-j\overline{T}), & i=0,\ldots,K-1 \\ \sum_{j=0}^{K} (-1)^j \binom{K}{j} \delta(t-j\overline{T}), & i=K \end{cases} \quad \text{EQ 19}$$

wherein the term:

$$g_{ij}(t-j\overline{T}) = \begin{cases} \frac{1}{(K-i-1)!}(t-j\overline{T})^{K-i-1}, & t \in [j\overline{T}, T] \\ 0, & i=K, \text{ otherwise} \end{cases}$$

We denote by $T_w$ the observation time of the measurements from the device (300) relevant to the magnetic field vector and to the vector of angular rotation and we denote with N the sub-intervals of length $$T = \frac{T_w}{N}$$

seconds.

Advantageously, using said theory of modulating functions and said modulating function of the spline type, in said step of processing (410) of said second advantageous embodiment (600), in accordance with the present invention (400), one proceeds (610) to apply, for each time interval q=1, N defined for $t \in [(q-1)]T, qT]$, said inner product operator (EQ. 17) between that modulating function (EQ 19) and the differential equation of the calibration problem formulation (EQ. 6). Through this operation the original differential equation known (EQ. 6) is transformed into a new algebraic equation where the derivative of the term m(t) has been transferred to the term $\phi_K(t)$ of the modulating function:

$$[\int_0^T \phi_K(\tau) S_\omega(\tau+(q-1)T) d\tau] b = \int_0^T \phi_K(\tau)(S_\omega(\tau+(q-1)T) m(\tau+(q-1)T)+\dot{m}(\tau+(q-1)T)) d\tau \quad \text{EQ 20}$$

If we use the EQ. 18 in the previous EQ 20, we get:

$$\int_0^T \phi_K(\tau) S_\omega(\tau+(q-1)T) d\tau] b = \int_0^T \phi_K(\tau) S_\omega(\tau+(q-1)T) m(\tau+(q-1)T) d\tau - \int_0^T \dot{\phi}_K(\tau) m(\tau+(q-1)T) d\tau \quad \text{EQ 21}$$

which can be written as a matrix equation where the derivative of the term m(t) has been transferred to the term $\phi_K(t)$ of the modulating function:

$$G_q b = \zeta_q \quad \text{EQ. 22}$$

wherein:

$$G_q = \int_0^T \phi_K(\tau) S_\omega(\tau+(q-1)T) d\tau \quad \text{EQ. 23}$$

$$\zeta_q = \int_0^T \phi_K(\tau) S_\omega(\tau+(q-1)T) m(\tau+(q-1)T) d\tau - \int_0^T \dot{\phi}_K(\tau) m(\tau+(q-1)T) d\tau$$

Note that the EQ. 22 in accordance with said step of processing (410) of the proposed method (400) cannot be solved in closed form.

In said second advantageous embodiment (600), in accordance with the present invention (400), said step of reformulation of the algebraic equation (420) provides (620) to calculate an estimate $\hat{b}(t)$ of bias b starting from said algebraic equation (EQ. 22) as obtained in said step of processing (610) using a least squares solution of the equation:

$$\hat{b} = G^+ Z \quad \text{EQ. 24}$$

Said equation solvable by least squares is obtained by defining matrices $$G = \begin{bmatrix} G_1 \\ \vdots \\ G_N \end{bmatrix} \text{ and } Z = \begin{bmatrix} \zeta_1 \\ \vdots \\ \zeta_N \end{bmatrix}$$

which allow to rewrite EQ. 22 in the form Gb=Z where b is the bias of which the term $\hat{b}$ of EQ. 24 is the optimum estimate.

In accordance with the present invention (400), the calibration method in question provides that the width of the observation window, $T_w$, is chosen so as to ensure that the matrix G be of maximum rank.

Consequently, in said second advantageous embodiment (600), in accordance with the present invention (400), said bias estimation step (430) provides that (630):

the first data acquisition operation (431) uses a triaxial magnetometer and a gyroscope for the magnetic field and orientation measurement (631) by acquiring said measures on a time window of $T_w$ seconds.

the second operation of construction of the orientation array and the magnetic field array (432) provides for the relevant construction (632) starting from the measures relating to said time slot obtained in said first data acquisition operation by concatenating said magnetic field measurements inside a matrix $$Z = \begin{bmatrix} \zeta_1 \\ \vdots \\ \zeta_N \end{bmatrix}$$

and said orientation measures within a matrix $$G = \begin{bmatrix} G_1 \\ \vdots \\ G_N \end{bmatrix}$$

A third operation of numerical solution (433) of said algebraic equation reformulated as identified in said reformulation step (620) that performs (633) the optimal estimation in finite time of the bias vector b using a least squares technique on the data.

A fourth step in which the same algebraic equation is then solved for a subsequent time interval from T to T+$T_w$ and so on for successive windows of magnitude $T_w$.

A Calibration Method According to the Invention

Downstream of the above defrivation, the real-time calibration method of a magnetic field measurement according to the invention can be expressed in general terms as follows.

It uses at least one magnetic field sensor connected integrally to at least one angular rotation sensor and the corresponding measures to process a correction of the measurement bias. To this end, an electronic processor connected locally or remotely to said at least one magnetic field sensor and to said at least one angular rotation sensor performs the following steps:

A. acquiring a vector signal of the magnetic field by said at least one magnetic field sensor along time, said magnetic field vector signal being expressed in a sensor reference system, and comprising a magnetic bias;

B. acquiring a rotation vector signal by said at least an angular rotation sensor, along time;

C. sampling said vector signal of magnetic field and said rotation signal obtaining respectively a sampled magnetic field vector signal, m(t)=[$m_x$(t),$m_x$(t),$m_x$(t)] and a sampled rotation signal ω(t)=[$ω_x$(t), $ω_y$(t), $ω_z$(t)] at the time t;

D. constructing the following orientation matrix:

$$S_\omega(t) = \begin{bmatrix} 0 & -\omega_z(t) & \omega_y(t) \\ \omega_z(t) & 0 & -\omega_x(t) \\ -\omega_y(t) & \omega_x(t) & 0 \end{bmatrix}$$

Subsequently, on the basis of these data, the electronic processor estimates the bias according to the following steps:

E. numerically solving the following algebraic equation:

$$D\hat{b}(t)=Y$$

where $$D = \begin{bmatrix} D_1 \\ \vdots \\ D_n \end{bmatrix} \text{ and } Y = \begin{bmatrix} Y_1 \\ \vdots \\ Y_n \end{bmatrix}$$

in which $\hat{b}(t)$ is an estimate of bias b and $D_q$ is determined on the basis of $S_\omega$(t) and $Y_q$ is determined on the basis of m(t) and $S_\omega$(t), with $\hat{b}(t)$ being independent of the time derivative of the magnetic field components of the three-dimensional vector m(t), on each respective time interval q=1, ...., n defined for t∈[(q−1)ΔT,qΔT], in which n is a positive integer and ΔT a predefined time interval in which measurements by the sensors of steps A and B, or the sampling time of step C; and F. calculating a calibrated magnetic field $m_c$(t) as $m_c$(t) =m(t)−$\hat{b}$ as expressed in said sensor reference system.

At this point, one can apply various special methods for the solution of the equation: D$\hat{b}$(t)=Y, since the general method already shown solves the problem of estimating a time derivative of the magnetic field.

For example by defining:

$$\Delta T = T$$
$$n = \frac{T_w}{T}$$

in which T is a specified period of time and $T_w$ is a pre-defined observation window sufficiently wide as to ensure that the matrix D is full rank, one can use the expressions above derived for the solution by the modulating functions, in which the algebraic equation: D$\hat{b}$(t)=Y is solved numerically in the time window $T_w$, and wherein the same algebraic equation is then solved for a subsequent time interval from T to T+$T_w$ and so on for successive windows of width $T_w$.

Another example of solution is given by the application of above illustrated kernel functions and Volterra operator with and subsequently to Eq. 14 (in this case D=$M_f$(t), Y=$β_f$(t) and n=1.

More specific solutions are possible once the basic concept of the general formulation above is known.

Method for the Determination of Orientation and/or Position of a Sensor According to the Invention.

From erstwhile discussion, it is therefore clear that the correct magnetic field is a vector in the sensor reference system. For example, if the sensor is contained in a smartphone, the measured magnetic field will be expressed in the coordinates of the smartphone reference system. If one wants to then calculate the orientation of the smartphone (sensor) with respect to the magnetic field reference system, one will need to know the inclination of the smartphone with respect to an axis of the reference system. This, in some cases, may involve the use of a field sensor (e.g. gravitational field and therefore the use of an accelerometer), which measures the inclination of the smartphone with respect to said axis (in cases where it is not null by definition). This field sensor is also important for the determination of the position of the sensor in the magnetic field reference system.

Figure 7:
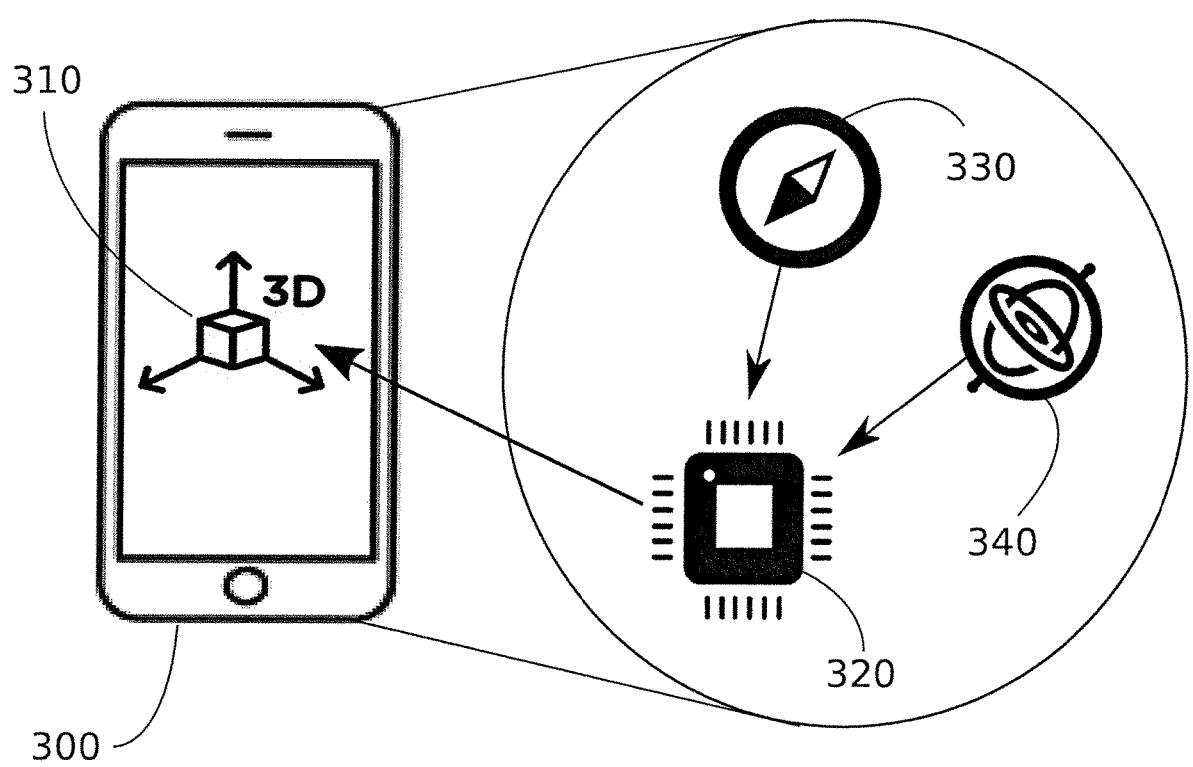
FIG. 7 shows an embodiment of the system according to the invention.

System for the Determination of Orientation and/or Position of a Sensor According to the Invention In FIG. 7 a diagram of a particular embodiment not limiting the invention is provided. A smartphone 300 indicates on the screen (optional) its orientation with respect to the local magnetic field. To do this, the magnetic sensor 330 provides the data to the CPU 320, which calibrates them by the data of the gyroscope 340, according to the method illustrated above. It is understood that this can also be done by a cloud server in communication with the smartphone, while the two sensors 330, 340 must be integral to the smartphone.

According to the method just described, an accelerometer or sensor field (eg. gravitational), not shown in the figure, can be included as well.

The CPU has code means capable of running a computer program that performs the steps of the methods above described starting from the sensor data.

The smartphone can be in general a mobile or a tablet device, a PDA or another.

Innovations and Advantages

In extreme synthesis, compared to conventional methods described, the method subject-matter of the present invention presents the following differences:

It allows the determination of the optimal estimate of bias without the need for the magnetometer to undergo major changes in its orientation;

It guarantees the convergence of the calculation method, and then determining the bias value;

It guarantees the finite time of execution of the method of calculation.

From these differences the following advantages ensue:

guarantee of obtaining of a resulting value for the estimation of the sought bias;

guarantee on the execution time of the calculation which is performed in a timeframe that can be pre-determined and set in advance;

non-dependence on orientations to which the magnetometer must be subjected, in order for the estimate of bias to be obtainable.

The invention thus conceived is susceptible to numerous modifications and variants, all falling within the scope of the appended claims.

Moreover, all the details may be replaced with other technically equivalent elements.

In practice, the means and materials employed, as well as the configurations, shapes and the dimensions, may be varied depending on the contingent requirements and state of the art.

Where the constructional characteristics and techniques mentioned in the following claims are followed by reference signs or numbers, such signs and reference numbers have been applied with the sole purpose of increasing the intelligibility of the claims and, consequently, they do not constitute in any way limitation of the interpretation of each element identified, purely by way of example, by such signs and reference numbers.

The invention claimed is:

1. A method for real-time calibration of the magnetic field detected by at least one magnetic field sensor, to the magnetic field sensor being connected in an integral manner at least an angular rotation sensor, the method comprising the following steps performed by an electronic processor locally or remotely connected to said at least one magnetic field sensor and said at least one angular rotation sensor, the method comprising:

A. acquiring, along time, a vector signal of the magnetic field by said at least a magnetic field sensor, said magnetic field vector signal being expressed in a sensor reference system, and comprising a magnetic bias;

B. acquiring a rotation vector signal by said at least an angular rotation sensor, along time;

C. sampling said vector signal of magnetic field and said rotation signal obtaining respectively a sampled magnetic field vector signal, $$m(t)=[m_x(t), m_x(t), m_x(t)];$$

and a sampled rotation signal $$\omega(t)=[\omega_x(t), \omega_z(t)]$$

at time t;

D. constructing the following orientation matrix:

$$S_\omega(t) = \begin{bmatrix} 0 & -\omega_z(t) & \omega_y(t) \\ \omega_z(t) & 0 & -\omega_x(t) \\ -\omega_y(t) & \omega_x(t) & 0 \end{bmatrix}$$

wherein the following steps are performed by said electronic processor:

E. numerically solving the following algebraic equation:

$$D\hat{b}(t)=Y$$

where $$D = \begin{bmatrix} D_1 \\ \vdots \\ D_n \end{bmatrix} \text{ and } Y = \begin{bmatrix} Y_1 \\ \vdots \\ Y_n \end{bmatrix}$$

in which $\hat{b}(t)$ is an estimate of the bias b and $D_q$ is a function of $S_\omega(t)$ and $Y_q$ is a function of $m(t)$ and $S_\omega(t), \hat{b}(t)$ being independent of the time derivative of the magnetic field components of the three-dimensional vector m(t), on each respective time interval q=1, ..., n defined for $t \in [q-1]\Delta T, q\Delta T]$, wherein n is a positive integer and $\Delta T$ a predefined time interval in which measurements by sensors of steps A and B are to be performed, or the sampling time of step C; and F. calculating a calibrated magnetic field $m_c(t)$ as $m_c(t) = m(t) - \hat{b}$ expressed in said sensor reference system.

2. The method according to claim 1, wherein:

$$\Delta T = T$$

$$n = \frac{T_w}{T}$$

in which T is a specified period of time and $T_w$ is a pre-defined observation window, sufficiently wide as to ensure that the matrix D is full rank, and wherein:

$$D_q = \int_0^T \phi_K(\tau) S_\omega(\tau+(q-1)T) d\tau$$

$$Y_q = \int_0^T \phi_K(\tau) S_\omega(\tau+(q-1)T) m(\tau+(q-1)T) d\tau - \int_0^T \phi K(\tau) m(\tau+(q-1)T) d\tau$$

wherein $\phi_K(t) \in C^K$ is a function called "modulating" function defined in the space of K times differentiable functions, with K positive integer, and is defined on a finite time interval [0,T] and satisfies the following boundary conditions:

$$\left. \frac{d^i \phi_K(t)}{dt^i} \right|_{t=0} = \left. \frac{d^i \phi_K(t)}{dt^i} \right|_{t=T} = 0, \forall i = 0, 1, \ldots, K-1$$

and wherein the algebraic equation:

$$D\hat{b}(t)=Y$$

is solved numerically in the time window $T_w$ and wherein the same algebraic equation is then solved for a subsequent time interval from T to $T+T_W$ and so on for successive windows of width $T_w$.

3. The method according to claim 2, wherein:

$$\frac{d^i \phi_K^s(t)}{dt^i} = \begin{cases} \sum_{j=0}^{K} (-1)^j \binom{K}{j} g_{ji}(t-j\overline{T}), & i=0, \ldots, K-1 \\ \sum_{j=0}^{K} (-1)^j \binom{K}{j} \delta(t-j\overline{T}), & i=K \end{cases}$$

-continued where $\bar{T} = \frac{T}{K}$ and $$g_{ij}(t - j\bar{T}) = \begin{cases} \frac{1}{(K-i-1)!}(t - j\bar{T})^{K-i-1}, & t \in [j\bar{T}, T] \\ 0, i = K, & \text{otherwise} \end{cases}$$

4. The method according to claim 1, wherein:

$$D_q = \left[\left(\frac{1}{s+\rho}[K(t,t)S_\omega(t)]\right)\right]_q$$

$$Y_q = \left[K(t,t)m(t) - \left[V_{\frac{\partial}{\partial \tau}K(t,\tau)}m\right](t) + [V_K S_\omega m](t)\right]_q$$

wherein $Y_q$ and $D_q$ axe discretizations on each interval q=1, . . . ,n of the matrices shown in the argument $$\frac{1}{s+\rho}$$

is a filter of the function $K(t,t)S_\omega(t)$ in the argument, s is the Laplace variable, p is a non-null positive real number, τ is a time variable, $V_K$ is the Volterra operator, and $$V_{\frac{\partial}{\partial \tau}K(t,\tau)}$$

is the Volterra operator applied to the derivative of $K(t,\tau)$, $K(t,\tau)$ being defined as:

$K(t,\tau)=e^{-\rho(t-\tau)}(1-e\rho\tau)$.

5. The method according to claim 4, wherein $D_q(t)$ is a so-called function persistently exciting in $\mathbb{R}^{3\times 3}$, wherein there are two constants r>0, T>0 such that for every t≥0 the following occurs:

$\int_{t-T}^{t} H^T(\tau)H(\tau)d\tau \geq rI > 0$ and the bias estimation is given by the solution of the following adaptive differential equation:

$\dot{b}(t)=M_f^{-1}(t)(-\mu sign(E(t))\sqrt{|E(t)|}+\dot{\beta}_f(t)-\dot{M}_f(t)\hat{b}(t))$ wherein $$M_f(t) = \left[\left(\frac{1}{s+\rho}[K(t,t)S_\omega(t)]\right)^T\left(\frac{1}{s+\rho}[K(t,t)S_\omega(t)]\right)\right]^f$$

$$\beta_f(t) = \left[\left(\frac{1}{s+\rho}[K(t,t)S_\omega(t)]\right)^T\left(K(t,t)m(t) - \left[V_{\frac{\partial}{\partial \tau}K(t,\tau)}m\right](t) + [V_K S_\omega m](t)\right)\right]^f$$

$E(t) = M_f(t)\hat{b}(t) - \beta_f(t)$ wherein the apex F indicates a filtering operation of the argument values in the square brackets of $M_f(t)$ and $\beta_f(t)$.

6. The method according to claim 5, wherein the filtering operation is of the low-pass type.

7. A method for the real time determination of the instantaneous orientation of a mobile device with respect to an axis of a reference system of a magnetic field, in particular the geomagnetic field, and/or for the determination of the position of said device with respect to said reference system, the mobile device comprising or being constituted by at least a magnetic field sensor and at least an angular rotation sensor, in which the magnetic field is determined according to the method of claim 1, and wherein a further step G is performed, by calculating the orientation of said device with respect to said magnetic field on the basis of the calibrated vector $m_c(t)$, on the basis of said reference system, and of a sensor of inclination of said sensor with respect to the plane perpendicular to said axis as measured by at least a sensor field in the case where the inclination is null.

8. A computer program, comprising code means configured to perform the steps A to F according to claim 1.

9. A computer program comprising code means configured to perform step G of claim 7.

10. A system for real time determination of the instantaneous orientation and/or the position of a mobile device with respect to a magnetic field defined in a reference system, comprising:
- at least a magnetic field sensor;
- at least an angular rotation sensor;
- at least a field sensor only in the case of the position determination; connected integrally to said device, and in local or remote communication with an electronic processor, wherein said computer program according to claim 9 is installed on said electronic processor.

11. The system according to claim 10, wherein said mobile device is a smartphone or tablet or PDA equipped internally with at least a magnetic field sensor and at least an angular rotation sensor, and said electronic processor is its CPU.

12. The system according to claim 10, wherein said magnetic field is the geomagnetic field.

* * * * *